(12) United States Patent
Li et al.

(10) Patent No.: US 11,469,404 B2
(45) Date of Patent: Oct. 11, 2022

(54) METHOD FOR MANUFACTURING DISPLAY PANEL, DISPLAY PANEL, AND DISPLAY APPARATUS

(71) Applicant: BOE Technology Group Co., Ltd., Beijing (CN)

(72) Inventors: Xiaohu Li, Beijing (CN); Zhiqiang Jiao, Beijing (CN); Tun Liu, Beijing (CN); Huajie Yan, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 16/768,924

(22) PCT Filed: Dec. 4, 2019

(86) PCT No.: PCT/CN2019/122984
§ 371 (c)(1),
(2) Date: Jun. 2, 2020

(87) PCT Pub. No.: WO2020/114423
PCT Pub. Date: Jun. 11, 2020

(65) Prior Publication Data
US 2021/0359284 A1 Nov. 18, 2021

(30) Foreign Application Priority Data
Dec. 6, 2018 (CN) .......................... 201811489984.9

(51) Int. Cl.
*H01L 51/56* (2006.01)
*H01L 27/32* (2006.01)
(Continued)

(52) U.S. Cl.
CPC .......... *H01L 51/56* (2013.01); *H01L 21/0274* (2013.01); *H01L 23/562* (2013.01);
(Continued)

(58) Field of Classification Search
CPC ..... H01L 23/562; H01L 27/3241–3279; H01L 27/3234; H01L 51/0012;
(Continued)

(56) References Cited

U.S. PATENT DOCUMENTS 6,593,687 B1 * 7/2003 Pei ...................... H01L 51/5012
445/24
10,115,679 B1 * 10/2018 Kuo ...................... H01L 23/585
(Continued)

FOREIGN PATENT DOCUMENTS

CN 103649271 A 3/2014
CN 104124142 A 10/2014
(Continued)

OTHER PUBLICATIONS

Machine translation, Ding, Chinese Pat. Pub. No. CN-108666347-A, translation date: Feb. 18, 2022, Clarivate Analytics, all pages. (Year: 2022).*
(Continued)

*Primary Examiner* — Victoria K. Hall
(74) *Attorney, Agent, or Firm* — Fay Sharpe LLP

(57) ABSTRACT

Disclosed is a method for manufacturing a display panel including: forming a base structure in a target region on a base substrate; forming a display structure layer on the base substrate on which the base structure is formed; forming an annular groove in the display structure layer in a region which an orthographic projection of the base structure on the display structure layer falls within, the base structure being exposed in the annular groove; and removing the base structure surrounded by the annular groove to separate the display structure layer surrounded by the annular groove from the base substrate.

16 Claims, 8 Drawing Sheets

(51) Int. Cl.
*H01L 21/027* (2006.01)
*H01L 23/00* (2006.01)
*H01L 51/00* (2006.01)

(52) U.S. Cl.
CPC ...... *H01L 27/3234* (2013.01); *H01L 27/3258* (2013.01); *H01L 51/003* (2013.01); *H01L 2227/323* (2013.01)

(58) Field of Classification Search
CPC .... H01L 51/0016–0019; H05K 3/0035; H05K 3/06–07; G03F 7/38; G03F 7/34–36
See application file for complete search history.

(56) References Cited

U.S. PATENT DOCUMENTS

| | | | | |
|---|---|---|---|---|
| 10,153,329 | B2 * | 12/2018 | Kao | H01L 51/56 |
| 11,152,592 | B2 * | 10/2021 | Gu | H01L 51/5253 |
| 11,195,993 | B2 * | 12/2021 | Rizzolo | H01F 41/302 |
| 11,335,753 | B2 * | 5/2022 | Ding | H01L 51/5281 |
| 2007/0190886 | A1 * | 8/2007 | Satoh | H01J 9/02 445/24 |
| 2009/0213884 | A1 | 8/2009 | Rosso et al. | |
| 2014/0202987 | A1 | 7/2014 | Nakata et al. | |
| 2017/0068287 | A1 * | 3/2017 | Jung | G02B 1/111 |
| 2017/0070679 | A1 | 3/2017 | Chung et al. | |
| 2017/0110684 | A1 | 4/2017 | Wang | |
| 2017/0214003 | A1 | 7/2017 | Lee et al. | |
| 2017/0323779 | A1 * | 11/2017 | Um | G02F 1/133305 |
| 2017/0346041 | A1 * | 11/2017 | Kim | H01L 51/0097 |
| 2018/0240849 | A1 * | 8/2018 | Kao | H01L 29/78696 |
| 2018/0342700 | A1 | 11/2018 | Cai et al. | |
| 2019/0172887 | A1 | 6/2019 | Sun et al. | |
| 2019/0253591 | A1 * | 8/2019 | Chen | G02F 1/1333 |
| 2020/0052244 | A1 * | 2/2020 | Gu | H01L 51/5253 |
| 2020/0075692 | A1 * | 3/2020 | Park | H01L 27/3244 |
| 2020/0106055 | A1 * | 4/2020 | Zhang | H01L 51/56 |
| 2020/0168849 | A1 * | 5/2020 | Jung | H01L 51/56 |
| 2020/0273926 | A1 * | 8/2020 | Lee | H01L 51/56 |
| 2021/0050391 | A1 * | 2/2021 | Son | H01L 51/0016 |
| 2021/0167327 | A1 * | 6/2021 | Cai | H01L 51/56 |
| 2021/0375948 | A1 * | 12/2021 | Ye | H01L 27/124 |
| 2021/0408450 | A1 * | 12/2021 | Wang | H01L 27/32 |

FOREIGN PATENT DOCUMENTS

| | | | | |
|---|---|---|---|---|
| CN | 105047769 | A | | 11/2015 |
| CN | 105206653 | A | | 12/2015 |
| CN | 106505086 | A | | 3/2017 |
| CN | 107359185 | A | | 11/2017 |
| CN | 107977632 | A | | 5/2018 |
| CN | 108196388 | A | | 6/2018 |
| CN | 108461655 | A * | 8/2018 | ........... G03F 7/2024 |
| CN | 108649133 | A | | 10/2018 |
| CN | 108666347 | A * | 10/2018 | ............. G09F 9/301 |
| CN | 108983469 | A * | 12/2018 | ......... G02F 1/13338 |
| CN | 109560114 | A | | 4/2019 |
| CN | 109728047 | A * | 5/2019 | ............. H01L 27/32 |
| CN | 110289291 | A * | 9/2019 | ......... H01L 27/3241 |
| CN | 209496874 | U * | 10/2019 | ............. H01L 27/32 |
| CN | 110429118 | A * | 11/2019 | ............. H01L 27/32 |
| CN | 110459693 | A * | 11/2019 | ............. H01L 51/52 |
| CN | 110491913 | A * | 11/2019 | ......... H01L 27/3244 |
| JP | H08255560 | A | | 10/1996 |
| WO | WO-2019205747 | A1 * | 10/2019 | ........... H01L 23/367 |
| WO | WO-2019214620 | A1 * | 11/2019 | ......... H01L 27/3244 |

OTHER PUBLICATIONS

Machine translation, Qingwen, Chinese Pat. Pub. No. CN-108983469-A, translation date: Feb. 18, 2022, Clarivate Analytics, all pages. (Year: 2022).*

Machine translation, Li, Chinese Pat. Pub. No. CN-109728047-A, translation date: Feb. 18, 2022, Clarivate Analytics, all pages. (Year: 2022).*

Machine translation, Xiao, Chinese Pat. Pub. No. CN-110289291-A, translation date: Feb. 18, 2022, Clarivate Analytics, all pages. (Year: 2022).*

Machine translation, Zhao, Chinese Pat. Pub. No. CN-110429118-A, translation date: Feb. 18, 2022, Clarivate Analytics, all pages. (Year: 2022).*

Machine translation, Cai, Chinese Pat. Pub. No. CN-110459693-A, translation date: Feb. 18, 2022, Clarivate Analytics, all pages. (Year: 2022).*

Machine translation, Jiang, Chinese Pat. Pub. No. CN-110491913-A, translation date: Feb. 18, 2022, Clarivate Analytics, all pages. (Year: 2022).*

Machine translation, Li, Chinese Pat. Pub. No. CN-209496874-U, translation date: Feb. 18, 2022, Clarivate Analytics, all pages. (Year: 2022).*

Machine translation, Xing, WIPO Pat. Pub. No. WO-2019205747-A1, translation date: Feb. 18, 2022, Clarivate Analytics, all pages. (Year: 2022).*

Machine translation, Wang, WIPO Pat. Pub. No. WO-2019214620-A1, translation date: Feb. 18, 2022, Clarivate Analytics, all pages. (Year: 2022).*

Machine translation, Gao, Chinese Pat. Pub. No. CN-108461655-A, translation date: Feb. 18, 2022, Clarivate Analytics, all pages. (Year: 2022).*

First office action of Chinese application No. 201811489984.9 dated Apr. 15, 2020.

* cited by examiner

| Optical adjustment layer |
|:-:|
| Cathode |
| EIL |
| ETL |
| EL |
| HTL |
| HIL |

FIG. 9

METHOD FOR MANUFACTURING DISPLAY PANEL, DISPLAY PANEL, AND DISPLAY APPARATUS

The application is a 371 of PCT Application No. PCT/CN2019/122984, filed on Dec. 4, 2019, which claims priority to Chinese Patent Application No. 201811489984.9 filed on Dec. 6, 2018 and entitled "DISPLAY PANEL MANUFACTURING METHOD, DISPLAY PANEL AND DISPLAY DEVICE", the entire contents of which are incorporated herein by reference.

TECHNICAL FIELD

The present disclosure relates to the field of display technologies, and in particular, relates to a method for manufacturing a display panel, a display panel, and a display apparatus.

BACKGROUND

A display apparatus generally includes a display panel and an image acquisition assembly.

In a method for manufacturing a display panel in the related art, a notch is formed on an edge of a base substrate by a cutting process, and then various display structures are sequentially arranged on the base substrate, and an encapsulation structure is formed on the base substrate provided with various display structures to form a display panel with a notch on a side edge. An image acquisition assembly may be arranged at this notch.

SUMMARY

Embodiments of the present disclosure provide a method for manufacturing a display panel, a display panel, and a display apparatus. The technical solutions are as follows:

According to one aspect of the present disclosure, a method for manufacturing a display panel is provided. The method includes:

forming a base structure in a target region on a base substrate;

forming a display structure layer on the base substrate on which the base structure is formed;

forming an annular groove in the display structure layer in a region which an orthographic projection of the base structure on the display structure layer falls within, the base structure being exposed in the annular groove; and removing the base structure surrounded by the annular groove to separate the display structure layer surrounded by the annular groove from the base substrate.

Optionally, before forming the display structure layer on the base substrate on which the base structure is formed, the method further includes:

forming at least one retaining wall surrounding the target region on the base substrate on which the base structure is formed; and forming the display structure layer on the base substrate on which the base structure is formed includes:

forming the display structure layer on the base substrate on which the at least one retaining wall is formed.

Optionally, before forming the display structure layer on the base substrate on which the base structure is formed, the method further includes:

forming a plurality of protrusive structures on the base structure.

Optionally, before forming the display structure layer on the base substrate on which the base structure is formed, the method further includes:

forming a plurality of protrusive structures and at least one retaining wall surrounding the target region on the base substrate on which the base structure is formed, the plurality of protrusive structures being disposed on the base structure; and forming the display structure layer on the base substrate on which the base structure is formed includes:

forming the display structure layer on the base substrate on which the plurality of protrusive structures and at least one retaining wall are formed.

Optionally, forming the at least one retaining wall surrounding the target region on the base substrate on which the base structure is formed includes:

forming a negative photoresist layer on the base substrate on which the base structure is formed; and treating the negative photoresist layer into the at least one retaining wall surrounding the target region by an exposure process and a development process.

Optionally, forming the plurality of protrusive structures on the base structure includes:

forming a negative photoresist layer on the base substrate on which the base structure is formed; and treating the negative photoresist layer into the plurality of protrusive structures by an exposure process and a development process.

Optionally, forming the plurality of protrusive structures and at least one retaining wall surrounding the target region on the base substrate on which the base structure is formed includes:

forming a negative photoresist layer on the base substrate on which the base structure is formed; and treating the negative photoresist layer into the plurality of protrusive structures and the at least one retaining wall surrounding the target region by an exposure process and a development process.

Optionally, forming the plurality of protrusive structures and the at least one retaining wall surrounding the target region on the base substrate on which the base structure is formed includes:

forming the plurality of protrusive structures and at least one retaining wall surrounding the target region on the base substrate on which the base structure is formed by one patterning process.

Optionally, the protrusive structure is columnar, and an area of one end of the protrusive structure distal from the base substrate is greater than that of the other end of the protrusive structure.

Optionally, a thickness of the retaining wall gradually increases in a direction distal from the base substrate.

Optionally, a drive circuit is formed on the base substrate, wherein a region which an orthographic projection of the drive circuit on the base substrate falls within does not overlap the target region, and any metal structure or metal oxide structure in the base structure and the drive circuit is formed by the same patterning process.

Optionally, removing the base structure surrounded by the annular groove to separate the display structure layer surrounded by the annular groove from the base substrate includes:

removing the base structure surrounded by the annular groove by a wet etching process to separate the display structure layer surrounded by the annular groove from the base substrate.

Optionally, the base structure is made of a positive photoresist, and removing the base structure surrounded by the annular groove to separate the display structure layer surrounded by the annular groove from the base substrate includes:

exposing the base structure from a side where the base structure is not provided with the base structure; and removing the base structure surrounded by the annular groove by a development process to separate the display structure layer surrounded by the annular groove from the base substrate.

Optionally, before forming the base structure on a base substrate, the method further includes:

forming a buffer layer on the base substrate; and forming the base structure on a base substrate includes:

forming the base structure on the base substrate on which the buffer layer is formed.

Optionally, forming the annular groove in the display structure layer in the region which the orthographic projection of the base substrate on the display structure layer falls within, the base structure being exposed in the annular groove, includes:

forming the annular groove by laser cutting in the display structure layer in the region which an orthographic projection of the base structure on the display structure layer falls within, the base structure being exposed in the annular groove.

Optionally, before forming the base structure on the base substrate, the method further includes:

forming a buffer layer on the base substrate;

forming the base structure on the base substrate includes:

forming the base structure on the base substrate on which the buffer layer is formed;

before forming the display structure layer on the base substrate on which the base structure is formed, the method further includes:

forming a negative photoresist layer on the base substrate on which the base structure is formed; and treating the negative photoresist layer into a plurality of protrusive structures and at least one retaining wall surrounding the target region by an exposure process and a development process, the plurality of protrusive structures being disposed on the base structure, the protrusive structure being columnar, an area of one end of the protrusive structure distal from the base substrate being greater than that of the other end of the protrusive structure, and a thickness of the retaining wall gradually increasing in a direction distal from the base substrate; and forming the display structure layer on the base substrate on which the base structure is formed includes:

forming the display structure layer on the base substrate on which the plurality of protrusive structures and at least one retaining wall are formed;

wherein a drive circuit is formed on the base substrate, a region which an orthographic projection of the drive circuit on the base substrate falls within not overlapping the target region, and any metal structure or metal oxide structure in the base structure and the drive circuit being formed by a same patterning process.

In another aspect, a display panel is provided. The display panel includes the display panel manufactured by the above method. The display panel includes a base substrate, wherein the base substrate includes a target region; and a region on the base substrate other than the target region is provided with a display structure layer.

Optionally, the base substrate includes at least one retaining wall surrounding the target region; and the display structure layer is disposed on the base substrate on which the at least one retaining wall is provided.

Optionally, a region on the base substrate other than the target region is provided with a drive circuit, and the display structure layer is disposed on the base substrate provided with the drive circuit.

In another aspect, a display apparatus is provided. The display apparatus includes an image acquisition assembly and the above display panel;

wherein the image acquisition assembly is disposed on a side of the base substrate of the display panel, and an orthographic projection of the image acquisition assembly on the base substrate overlaps with the target region of the base substrate.

The target region base structure display structure layer base structure base structure base structure display structure layer target region.

BRIEF DESCRIPTION OF THE DRAWINGS

FIG. 9 is a schematic structural diagram of the organic display structure layer in the base substrate shown in FIG. 8;

DETAILED DESCRIPTION

The embodiments of the present disclosure are described hereinafter with reference to the drawings.

At present, people are imposing a higher and higher requirement on a screen-to-body ratio of a terminal (such as a mobile phone, a tablet computer, a portable game console, and a wearable device), but due to other functional requirements for a terminal, such as an image acquisition function, the screen-to-body ratio of a terminal may hardly reach 100%.

In a method for manufacturing a display panel in the related art, an image acquisition assembly is arranged by punching or cutting a notch in the display panel to increase the screen-to-body ratio, but the way of forming a notch by punching or cutting is likely to damage a base substrate in the display panel, which in turn results in a low yield rate of display panels and an increased manufacturing cost.

Embodiments of the present disclosure provide a method for manufacturing a display panel, a display panel, and a display apparatus.

Figure 1:
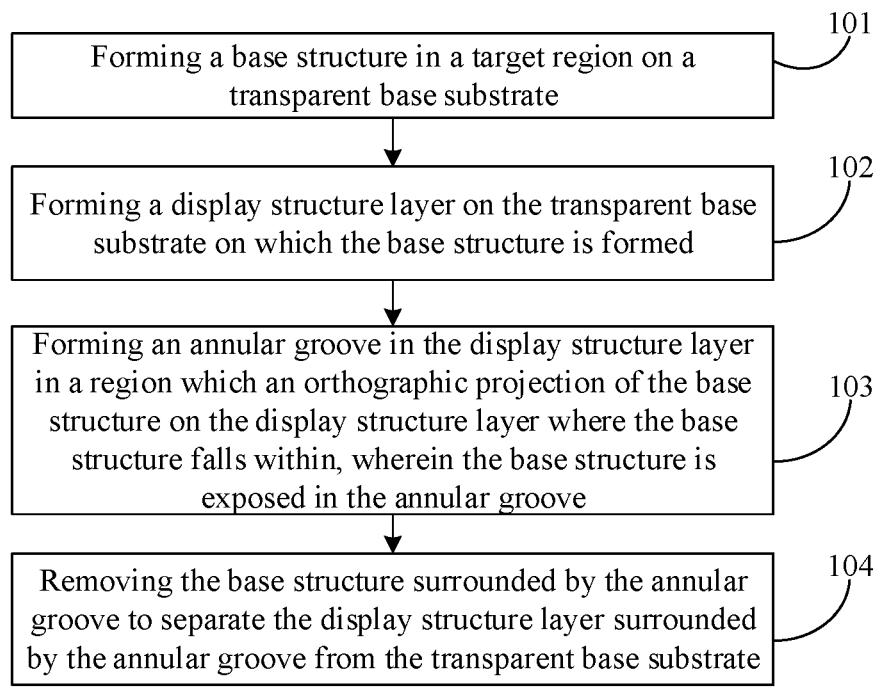
FIG. 1 is a flowchart of a method for manufacturing a display panel according to an embodiment of the present disclosure.

FIG. 1 is a flowchart of a method for manufacturing a display panel according to an embodiment according to the present disclosure. The method for manufacturing a display panel may include the following steps:

In step 101, a base structure is formed in a target region on abase substrate.

In step 102, a display structure layer is formed on the base substrate on which the base structure is formed.

In step 103, an annular groove is formed in the display structure layer in a region which an orthographic projection of the base structure on the display structure layer falls within, wherein the base structure is exposed in the annular groove.

In step 104, the base structure surrounded by the annular groove is removed to separate the display structure layer surrounded by the annular groove from the base substrate.

The base substrate may be a transparent base substrate.

After the display structure layer surrounded by the annular groove is separated from the base substrate, the target region is a transparent region, and an image acquisition assembly may be arranged at a position corresponding to the transparent region to implement a function of a front camera. The display structure layer may include structures such as an organic display structure layer.

In summary, in the method for manufacturing the display panel according to the embodiment of the present disclosure, a base structure is formed in a target region on a base substrate, then a display structure layer is formed on the base substrate on which the base structure is formed, and thereafter, by removing the base structure, a part of the display structure layer on the base structure may be separated from the base substrate. As such, the target region is a transparent region, and an image acquisition assembly or other assemblies may be arranged at a position corresponding to the transparent region, without cutting the base substrate during the manufacturing process. The problem of low yield rate of display panels in the related art is solved. Therefore, the yield rate of display panels is improved.

Figure 2:
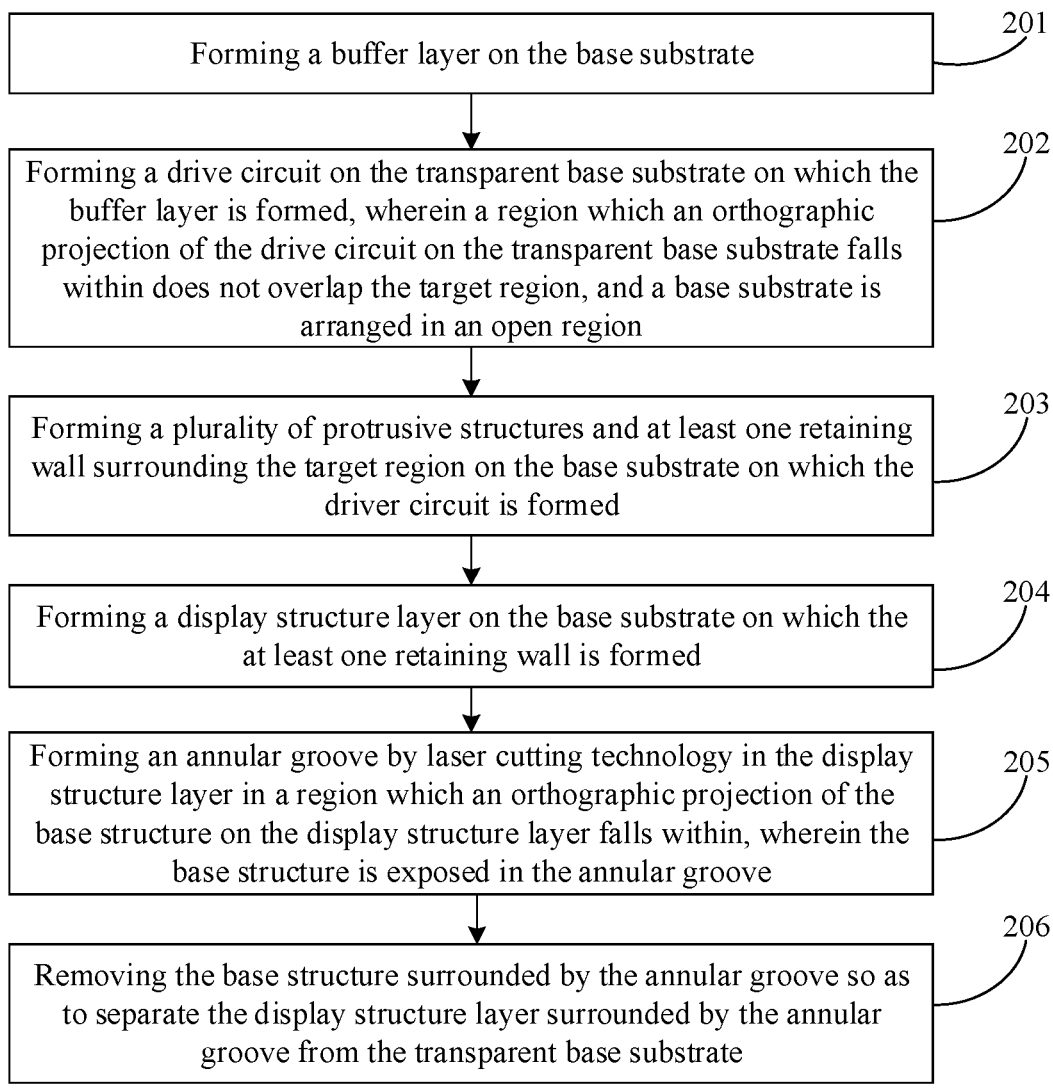
FIG. 2 is a flowchart of a method for manufacturing another display panel according to an embodiment of the present disclosure.

FIG. 2 is a flowchart of a method for manufacturing another display panel according to an embodiment of the present disclosure. The method for manufacturing the display panel may include the following steps:

In step 201, a buffer layer is formed on the base substrate.

The buffer layer may be made of a transparent material, which may protect the base substrate in subsequent processes. Illustratively, the buffer layer may be made of a material such as a silicon nitride.

In step 202, a drive circuit is formed on the base substrate on which a transparent buffer layer is formed, wherein a region which an orthographic projection of the drive circuit on the transparent base substrate falls within does not overlap the target region, and a base substrate is arranged in an open region.

The target region on the base substrate is a predefined region, and the target region is used to achieve an effect of transparency.

The target region may not be provided with a driver circuit, to increase transparency of the target region. The target region may be provided with a base structure. The driver circuit may include traces, electrodes, capacitors, thin film transistor (TFT), and the like. However, without affecting light transmittance of the target region, a part of the driver circuit may also be arranged in the target region, which is not limited in the embodiment of the present disclosure.

In the embodiment of the present disclosure, the base structure may be formed by the following two ways:

In the first way, the base structure may be disposed on the same layer as a certain metal structure (such as source and drain or the like) or a metal-oxide structure (such as a transparent conductive film layer (indium tin oxide) or the like) of the drive circuit. That is, the base structure may be formed by a same patterning process as a certain metal structure or a metal-oxide structure of the drive circuit, such that manufacturing procedures and costs may be reduced. In addition, the material of the base structure formed by the same patterning process as a certain metal structure or a metal-oxide structure of the drive circuit is also a metal or a metal oxide, which facilitates subsequent processes to remove the base structure surrounded by the annular groove.

In the second way, a base structure made of a positive photoresist may be formed. The positive photoresist is a material that may turn into a soluble substance when exposed to light.

Figure 3:
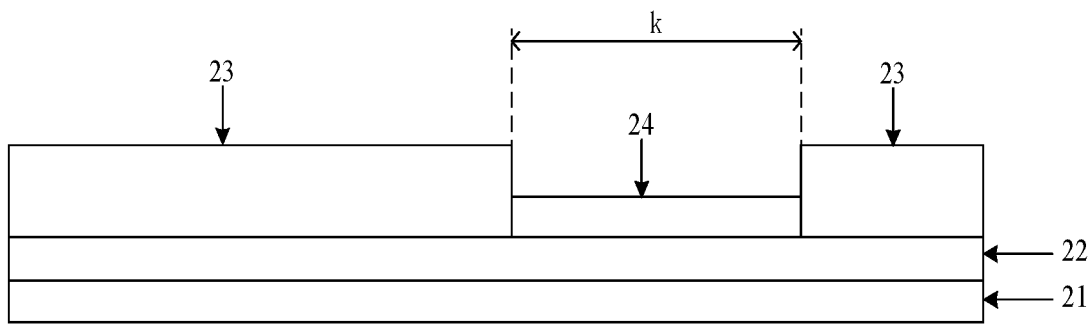
FIG. 3 is a schematic structural diagram of a base substrate in the embodiment shown in FIG. 2.

FIG. 3 is a schematic structural diagram of a base substrate at the end of step 202. A buffer layer 22 is formed on a base substrate 21, and a driver circuit 23 is formed on the buffer layer 22. The driver circuit 23 is provided with an opening in a target region k (i.e., an opening where no circuit is arranged), and a base structure 24 is arranged in the target region k.

In step 203, a plurality of protrusive structures and at least one retaining wall surrounding the target region are formed on the base substrate on which the base structure is formed.

The retaining wall may be used as an isolation zone between the target region and another region (such as a display region) outside the target region, thereby avoiding impact of various processes (such as subsequent laser cutting) performed for the target region on the normal structure of another region. The greater the number of turns of the retaining wall, the better the protection effect for another region outside the target region.

The protrusive structure may be used to reduce the degree of adhesion between a display structure layer and a base structure formed subsequently, to facilitate separation of the display structure layer.

Figure 4:
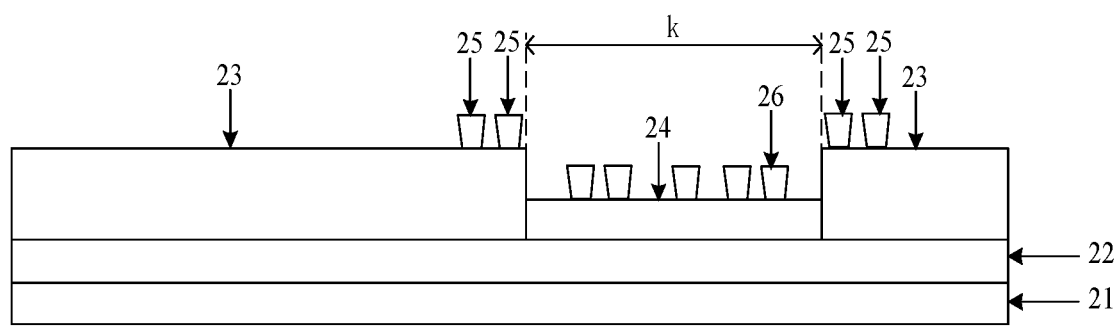
FIG. 4 is a schematic structural diagram of another base substrate in the embodiment shown in FIG. 2.

FIG. 4 is a schematic structural diagram of a base substrate at the end of step 203. A retaining wall 25 and a protrusive structure 26 are formed on a base substrate 21 on which a driver circuit 23 is formed. The retaining wall 25 externally surrounds a target region k, and the protrusive structure 26 is disposed in the target region k.

Alternatively, a plurality of protrusive structures 26 may be evenly distributed in the target region k, or the plurality of protrusive structures 26 may be distributed in the target region k according to a specified arrangement, which may be predetermined based on an experiment and facilitate to separate a subsequently formed display structure layer.

Alternatively, a thickness of the retaining wall 25 gradually increases in a direction distal from the base substrate 21, that is, a cross-section of the retaining wall along a designated surface is an inverted trapezoid, and the designated surface is a surface perpendicular to the base substrate 21 (illustratively, the designated surface may be the paper surface in FIG. 4).

When the cross-section of the retaining wall is an inverted trapezoid, impact of various processes performed for the target region on the normal structure of another region can be further avoided. For example, cracks in a structure above the retaining wall can be prevented from spreading outside the target region.

Alternatively, the protrusive structure 26 has a column shape (including a cylindrical shape and a square column shape), and an area of an end of the protrusive structure 26 distal from the base substrate 21 is greater than an area of an end of the protrusive structure 26 proximal to the base substrate 21. Such a structure can reduce the degree of adhesion to a subsequently formed display structure layer and facilitate separation of the display structure layer.

Figure 5:
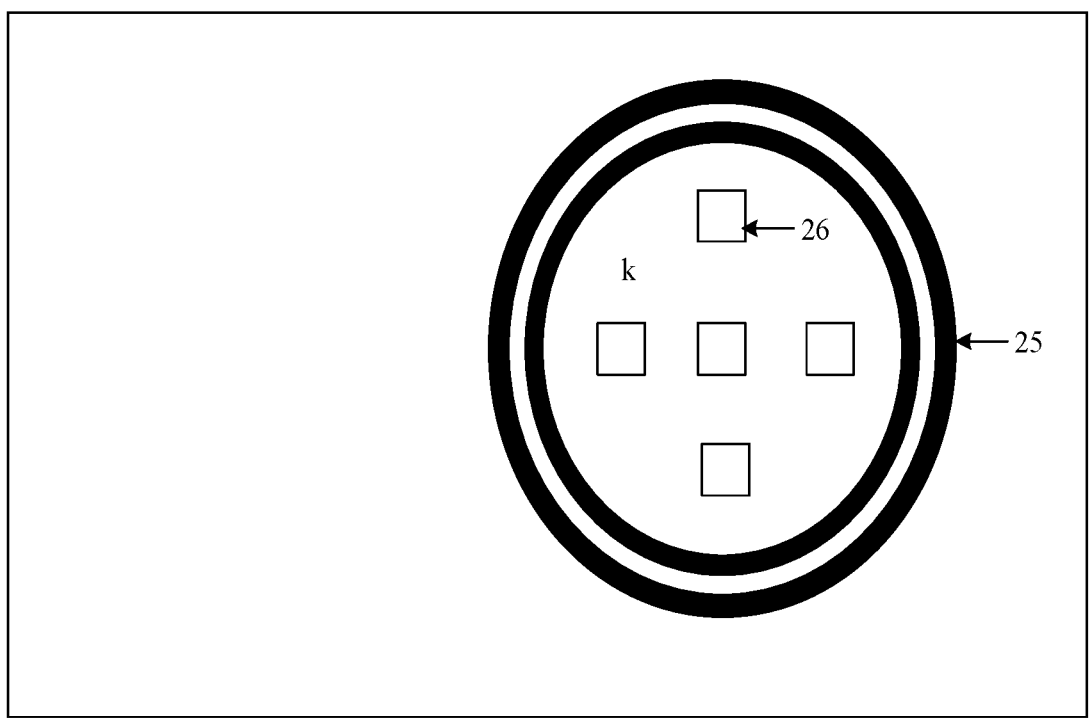
FIG. 5 is a top view of the base substrate shown in FIG. 4.

FIG. 5 is a top view of the base substrate shown in FIG. 4. Annular retaining walls 25 (shown in FIG. 5 is a case where the number of retaining walls are two, but this is not limited) externally surround a target region k. A protrusive structure 26 is arranged in the target region k. FIG. 5 shows a case where the protrusive structure 26 has a square column shape, however, the protrusive structure 26 may also have a cylindrical shape, which is not limited in the embodiment of the present disclosure.

FIG. 5 shows a case where the target region k has a circular shape. However, the target region k may also have other shapes, such as ellipse, rectangle, pentagon, hexagon or the like, which is not limited in the embodiment of the present disclosure.

Figure 6:
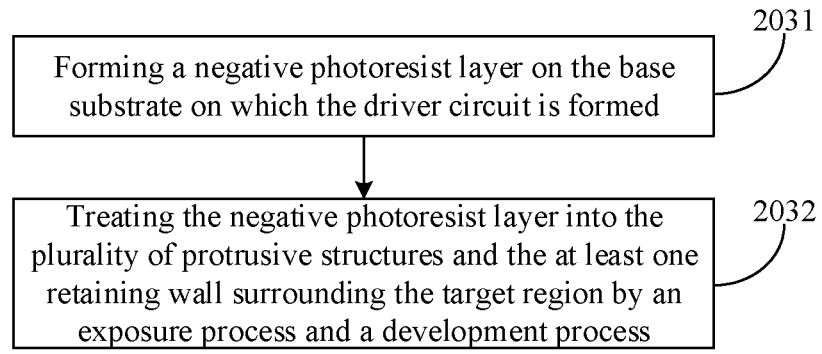
FIG. 6 is a flowchart of forming a retaining wall and a protrusive structure in the embodiment shown in FIG. 2.

Alternatively, as shown in FIG. 6, step 203 may include the following two sub-steps:

In sub-step 2031, a negative photoresist layer is formed on the base substrate on which the base structure is formed.

The negative photoresist is a material that turns into an insoluble substance when exposed to light.

In sub-step 2032, the negative photoresist layer is treated into the plurality of protrusive structures and at least one retaining wall surrounding the target region by an exposure process and a development process.

During the exposure process, the closer a part of the negative photoresist is to the surface, the more light it is irradiated, and the closer a part of the negative photoresist is to the surface, the greater the size of an insoluble substance the negative photoresist turns into, which enables the formation of an inverted trapezoidal insoluble structure by the negative photoresist, and thereafter, the part that has not turned into an insoluble substance may be removed by a development process, to treat the negative photoresist layer into the plurality of protrusive structures and at least one retaining wall surrounding the target region. As such, procedures and manufacturing costs can be reduced.

Alternatively, the protrusive structure and the retaining wall may also be formed by a negative photoresist layer, which is not limited in the embodiment of the present disclosure. In addition, the protrusive structure and the retaining wall may also be formed by a positive photoresist, which is not limited in the embodiment of the present disclosure.

In addition, the protrusive structure and the retaining wall may further be formed by the same patterning process. The patterning process may include procedures of forming a photoresist, exposing, developing, etching and stripping the photoresist, and the like.

In an embodiment of the present disclosure, both or neither of the retaining wall and the protrusive structure may be provided, or any one of the retaining wall and the protrusive structure may be provided, which is not limited in the embodiment of the present disclosure.

Step 204, forming a display structure layer on the base substrate on which the at least one retaining wall is formed.

The display structure layer may be an organic display structure layer, and the organic display structure layer may include a plurality of organic display structures and an encapsulation layer on the organic display structure.

Figure 7:
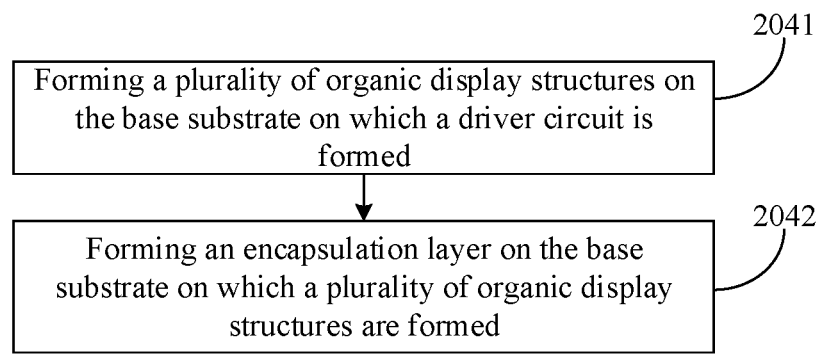
FIG. 7 is a flowchart of forming an organic display structure layer in the embodiment shown in FIG. 2.

As shown in FIG. 7, step 204 may include the following two sub-steps:

In step 2041, a plurality of organic display structures are formed on the base substrate on which a driver circuit is formed.

Each organic display structure may include structures such as an optical adjustment layer (which is used to allow light to exit the organic display structure layer), a cathode, an electron inject layer (EIL), an electron transport layer (ETL), an organic emission layer, a hole transport layer (HTL), and a hole inject layer (HIL).

The method for manufacturing a display panel according to the embodiment of the present disclosure may manufacture an organic light-emitting diode (OLED) display panel.

In step 2042, an encapsulation layer is formed on the base substrate on which a plurality of organic display structures are formed.

The encapsulation layer may be used to protect the plurality of organic display structures. A part of the encapsulation layer in the target region may be a single-layer structure, a material of which may include silicon nitride, silicon oxide and the like. In other regions than the target region, the encapsulation layer may be an encapsulation layer including a multi-layer structure and formed by a thin-film encapsulation process (TFE).

Figure 8:
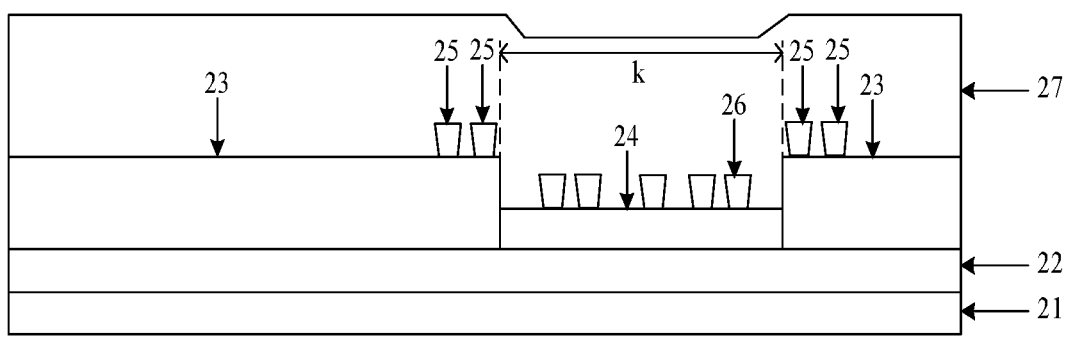
FIG. 8 is a schematic structural diagram of another base substrate in the embodiment shown in FIG. 2.

FIG. 8 is a schematic structural diagram of a base substrate at the end of step 204. A display structure layer 27 is formed on a base substrate on which a retaining wall 25 and a protrusive structure 26 are formed.

FIG. 9 is a schematic structural diagram of the display structure layer 27 in the base substrate shown in FIG. 8. The display structure layer 27 may include an optical adjustment layer, a cathode, an EIL, an ETL, an EL, an HTL, and an HIL. FIG. 9 does not show an encapsulation layer.

In step 205, an annular groove is formed by laser cutting in the display structure layer in a region which an orthographic projection of the base structure on the display structure layer falls within, wherein the base structure is exposed in the annular groove.

Laser cutting may accurately cut an annular groove in the region which an orthographic projection of the base structure on the display structure layer falls within, thereby exposing the base structure in the annular groove. The annular groove may have a circular ring shape, a square ring shape or another shape, which is not limited in the embodiment of the present disclosure.

Figure 10:
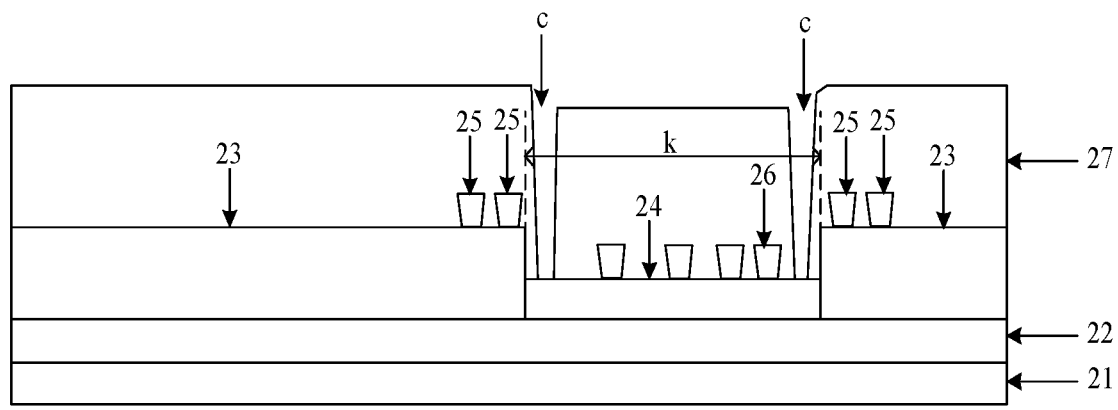
FIG. 10 is a schematic structural diagram of another base substrate in the embodiment shown in FIG. 2.

FIG. 10 is a schematic structural diagram of a base substrate at the end of step 205. An annular groove c is cut out of the display structure layer 27, and the base structure 24 is exposed in the annular groove c. Due to isolation of the retaining wall 25, cracks generated during cutting may not spread to a region outside the target region k, which avoids affecting normal display of the display panel.

Figure 11:
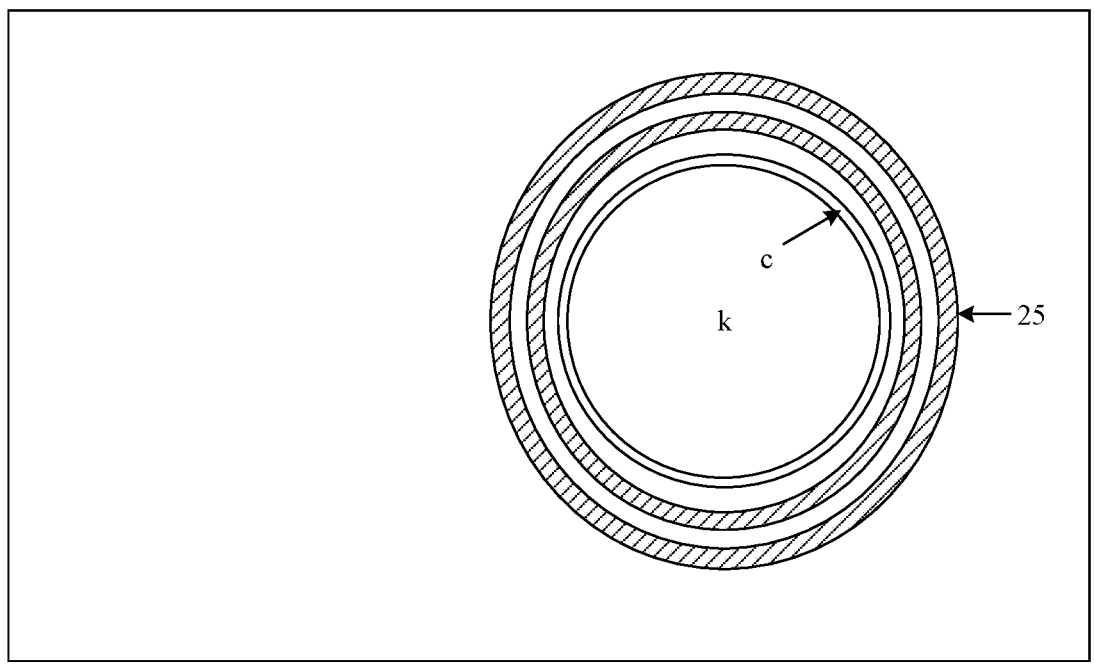
FIG. 11 is a top view of the base substrate shown in FIG. 10.

FIG. 11 is a top view of FIG. 10. An annular groove c is cut out around the target region k. The retaining walls 25 are shown as a perspective structure.

In step 206, the base structure surrounded by the annular groove is removed to separate the display structure layer surrounded by the annular groove from the base substrate.

After removal of the base structure and separation of the display structure layer surrounded by the annular groove from the base substrate, the display structure layer may not form a barrier to the target region of the base substrate, thereby achieving an effect of transparency in the target region. In addition, the entire base structure may also be removed, which is not limited in the embodiment of the present disclosure.

In the embodiments of the present disclosure, the base structure surrounded by the annular groove may be removed by the following two ways:

In the first way, when the base structure is made of a metal or a metal oxide:

the base structure surrounded by the annular groove is removed by wet etching. The wet etching is an etching method for etching with an etching liquid, and may more easily remove the base structure. The etching liquid may be in contact with the base structure by the groove and may corrode the base structure. Afterwards, the display structure layer surrounded by the annular groove may be washed away.

Since the display structure layer covers the top of the retaining wall, the display structure layer above the retaining wall may be lifted by the retaining wall, such that each structure layer in the display structure layer above the retaining wall may be thinner. Thus it is difficult for the etching liquid to go over the display structure layer above the retaining wall during etching the base structure, and it is difficult for the etching liquid to affect the display structure layer of located in a display region outside the retaining wall. In addition, when the number of retaining walls is two or more, the film layer in the display structure layer except for the encapsulation layer may be disconnected between two retaining walls, which further prevents the etching liquid from affecting the display structure layer outside the retaining wall.

In the second way, when the base structure is made of a positive photoresist:

1) The base structure is exposed to light from a side of the base substrate provided with no base structure.

The base structure formed by positive photoresist may turn into soluble substance after the exposure.

2) The base structure surrounded by the annular groove is moved by a development process to separate the display structure layer disposed in the target region from the base substrate.

The base structure that has turned into soluble substance may be removed by a development process. Illustratively, the base structure may be removed by a developer.

Figure 12:
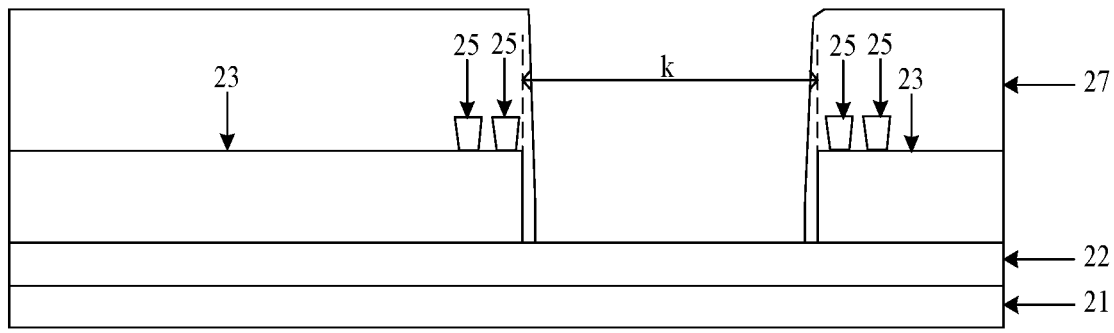
FIG. 12 is a schematic structural diagram of another base substrate in the embodiment shown in FIG. 2.

FIG. 12 is a schematic structural diagram of a base substrate at the end of step 206. The display structure layer surrounded by the annular groove is separated from the base substrate 21, such that the target region k is in a transparent state. An image acquisition assembly is arranged at a position corresponding to a side of the base substrate 21 distal from the buffer layer 22 to obtain an image of the front side of the display panel (the front side is a side of a display panel intended to display an image).

It should be noted that the method for manufacturing a display panel according to the embodiment of the present disclosure can manufacture at least one transparent target region in the display panel. Alternatively, the transparent target region may be disposed at the edge or corner of the transparent base substrate.

In summary, in the method for manufacturing the display panel according to the embodiment of the present disclosure, a substrate structure is formed on a target region on a base substrate, then a display structure layer is formed on a base substrate having the base structure, and thereafter, by removing the base structure, a part of the display structure layer on the base structure may be separated from the base substrate. As such, the target region is a transparent region, and an image acquisition assembly or other assemblies may be arranged at a position corresponding to the transparent region, without cutting the base substrate during the manufacturing process, and the problem of low yield rate of display panels in the related art is solved. Therefore, the yield rate of display panels is improved.

Figure 13:
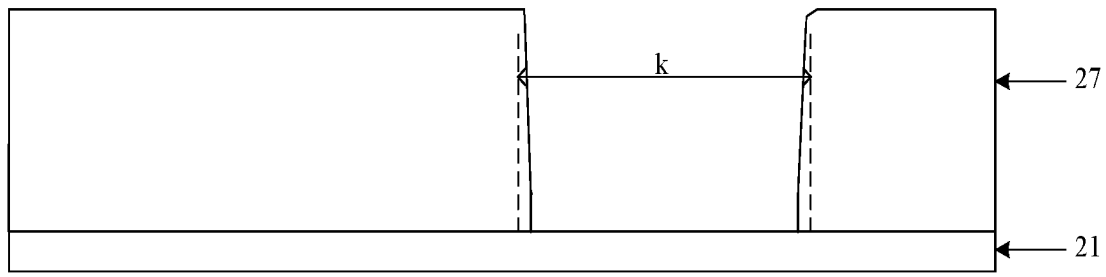
FIG. 13 is a schematic structural diagram of a display panel according to an embodiment according to the present disclosure.

In addition, an embodiment of the present disclosure further provides a display panel, which is manufactured by the above method shown in FIG. 1 or by the method shown in FIG. 2. As shown in FIG. 13, the display panel may include:

a base substrate 21, wherein the base substrate 21 includes a target region k; and a region on the base substrate 21 other than the target region k, wherein the region includes a display structure layer 27.

Alternatively, FIG. 12 a schematic structural diagram of another display panel according to an embodiment of the present disclosure. The base substrate 21 includes at least one retaining wall 25 surrounding the target region k, and the display structure layer 27 is disposed on the base substrate 21 on which the at least one retaining wall 25 is provided.

Alternatively, a region on the base substrate 21 other than the target region k is provided with a drive circuit 23, and the display structure layer 27 is disposed on the base substrate 21 provided with the drive circuit 23.

Figure 14:
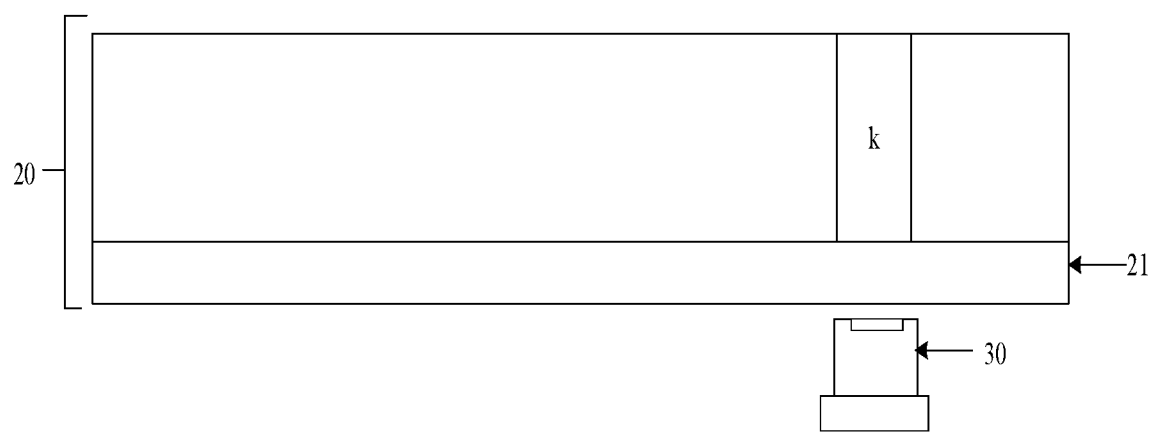
FIG. 14 is a schematic structural diagram of a display apparatus according to an embodiment according to the present disclosure.

FIG. 14 is a display apparatus according to an embodiment of the present disclosure. The display apparatus may include a display panel 20 and an image acquisition assembly 30. The display panel may be manufactured by the above method shown in FIG. 1 or by the method shown in FIG. 2.

The image acquisition assembly 30 is disposed on a side of the base substrate 21 of the display panel 20, and an orthographic projection of the image acquisition assembly on the base substrate 21 overlaps with an orthographic projection of the target region k of the display panel 20 on the base substrate 21. FIG. 14 shows the case where the image acquisition assembly 30 is disposed on the base substrate 21 distal from the display structure layer 27, however, the image acquisition assembly 30 may also be disposed on a side of the display structure layer 27 distal from the base substrate 21, which is not limited in the embodiment of the present disclosure.

Figure 15:
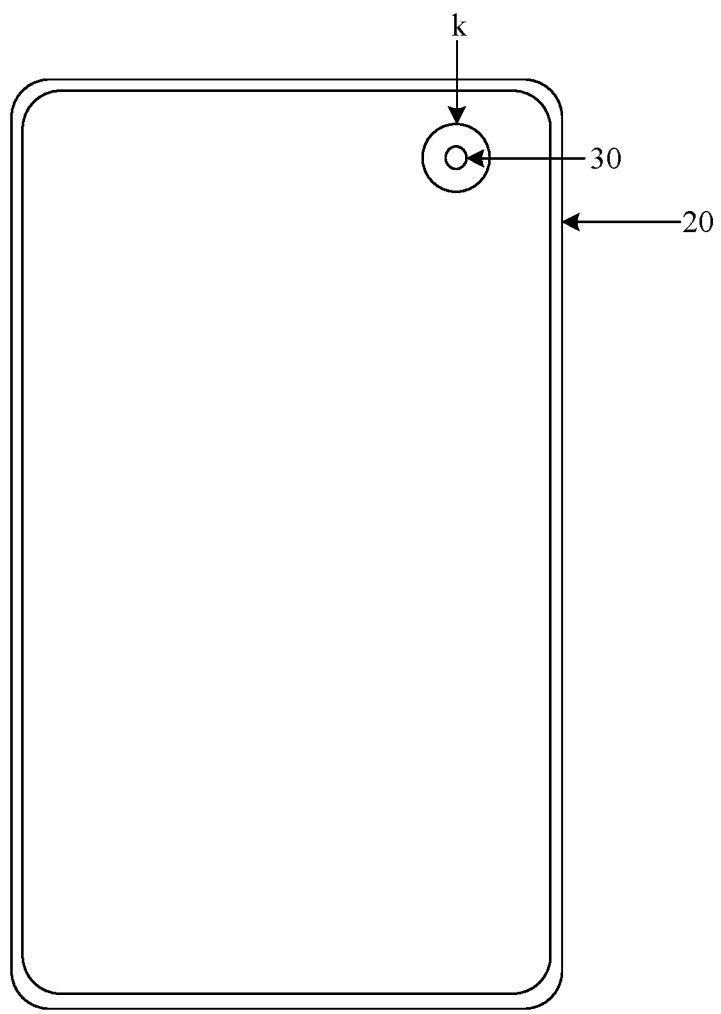
FIG. 15 is a top view of the display apparatus shown in FIG. 14.

FIG. 15 is a top view of the display apparatus shown in FIG. 14. The image acquisition assembly 30 disposed on the backside of the display panel 20 is exposed in the target region k. The image acquisition assembly 30 may obtain an image of the front side of the display panel 20 through the target region k.

It should be noted that in the accompanying drawings, for clarity of the illustration, the dimension of the layers and regions may be scaled up. It may be understood that when an element or layer is described as being "above" another element or layer, the described element or layer may be directly on the other element or layer, or at least one intermediate layer may be arranged between the described element or layer and the other element or layer. In addition, It may be understood that when an element or layer is described as being "below" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole specification described above, like reference numerals denote like elements.

In the present disclosure, the terms "first" and "second" are merely used to describe objects but not denote or imply any relative importance. The term "a plurality of" means two or more, unless otherwise expressly provided.

Described above are merely exemplary embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. A method for manufacturing a display panel, comprising:
   forming a base structure in a target region on a base substrate;
   forming a display structure layer on the base substrate on which the base structure is formed;
   forming an annular groove in the display structure layer in a region which an orthographic projection of the base structure on the display structure layer falls within, the base structure being exposed in the annular groove; and
   removing the base structure surrounded by the annular groove to separate the display structure layer surrounded by the annular groove from the base substrate.

2. The method according to claim 1, wherein before forming the display structure layer on the base substrate on which the base structure is formed, the method further comprises:
   forming at least one retaining wall surrounding the target region on the base substrate on which the base structure is formed; and
   forming the display structure layer on the base substrate on which the base structure is formed comprises:
   forming the display structure layer on the base substrate on which the at least one retaining wall is formed.

3. The method according to claim 2, wherein forming the at least one retaining wall surrounding the target region on the base substrate on which the base structure is formed comprises:
   forming a negative photoresist layer on the base substrate on which the base structure is formed; and
   treating the negative photoresist layer into the at least one retaining wall surrounding the target region by an exposure process and a development process.

4. The method according to claim 2, wherein a thickness of the retaining wall gradually increases in a direction distal from the base substrate.

5. The method according to claim 1, wherein before forming the display structure layer on the base substrate on which the base structure is formed, the method further comprises:
   forming a plurality of protrusive structures on the base structure.

6. The method according to claim 5, wherein forming the plurality of protrusive structures on the base structure comprises:
   forming a negative photoresist layer on the base substrate on which the base structure is formed; and
   treating the negative photoresist layer into the plurality of protrusive structures by an exposure process and a development process.

7. The method according to claim 5, wherein the protrusive structure is columnar, and an area of one end of the protrusive structure distal from the base substrate is greater than that of another end of the protrusive structure.

8. The method according to claim 1, wherein before forming the display structure layer on the base substrate on which the base structure is formed, the method further comprises:
   forming a plurality of protrusive structures and at least one retaining wall surrounding the target region on the base substrate on which the base structure is formed, the plurality of protrusive structures being disposed on the base structure; and
   forming the display structure layer on the base substrate on which the base structure is formed comprises:
   forming the display structure layer on the base substrate on which the plurality of protrusive structures and at least one retaining wall are formed.

9. The method according to claim 8, wherein forming the plurality of protrusive structures and the at least one retaining wall surrounding the target region on the base substrate on which the base structure is formed comprises:
   forming a negative photoresist layer on the base substrate on which the base structure is formed; and
   treating the negative photoresist layer into the plurality of protrusive structures and the at least one retaining wall surrounding the target region by an exposure process and a development process.

10. The method according to claim 8, wherein forming the plurality of protrusive structures and the at least one retaining wall surrounding the target region on the base substrate on which the base structure is formed comprises:
    forming the plurality of protrusive structures and at least one retaining wall surrounding the target region on the base substrate on which the base structure is formed by one patterning process.

11. The method according to claim 1, wherein a drive circuit is formed on the base substrate, a region which an orthographic projection of the drive circuit on the base substrate falls within does not overlap the target region, and one of metal structures or metal oxide structures in the drive circuit is formed by a same patterning process with the base structure.

12. The method according to claim 1, wherein removing the base structure surrounded by the annular groove to separate the display structure layer surrounded by the annular groove from the base substrate comprises:
    removing the base structure surrounded by the annular groove by a wet etching process to separate the display structure layer surrounded by the annular groove from the base substrate.

13. The method according to claim 1, wherein the base structure is made of a positive photoresist, and removing the base structure surrounded by the annular groove to separate the display structure layer surrounded by the annular groove from the base substrate comprises:
    exposing the base structure from a side where the base substrate is not provided with the base structure; and
    removing the base structure surrounded by the annular groove by a development process to separate the display structure layer surrounded by the annular groove from the base substrate.

14. The method according to claim 1, wherein before forming the base structure on the base substrate, the method further comprises:
   forming a buffer layer on the base substrate; and
   forming the base structure on the base substrate comprises:
   forming the base structure on the base substrate on which the buffer layer is formed.

15. The method according to claim 1, wherein forming the annular groove in the display structure layer in the region which the orthographic projection of the base structure on the display structure layer falls within, comprises:
   forming the annular groove by laser cutting in the display structure layer in the region which the orthographic projection of the base structure on the display structure layer falls within.

16. The method according to claim 1, before forming the base structure on the base substrate, the method further comprises:
   forming a buffer layer on the base substrate;
   forming the base structure on the base substrate comprises:
   forming the base structure on the base substrate on which the buffer layer is formed;
   before forming the display structure layer on the base substrate on which the base structure is formed, the method further comprises:
   forming a negative photoresist layer on the base substrate on which the base structure is formed; and
   treating the negative photoresist layer into a plurality of protrusive structures and at least one retaining wall surrounding the target region by an exposure process and a development process, the plurality of protrusive structures being disposed on the base structure, the protrusive structure being columnar, an area of one end of the protrusive structure distal from the base substrate being greater than that of another end of the protrusive structure, and a thickness of the retaining wall gradually increasing in a direction distal from the base substrate; and
   forming the display structure layer on the base substrate on which the base structure is formed comprises:
   forming the display structure layer on the base substrate on which the plurality of protrusive structures and at least one retaining wall are formed;
   wherein a drive circuit is formed on the base substrate, a region which an orthographic projection of the drive circuit on the base substrate falls within does not overlap the target area, and one of metal structures or metal oxide structures in the drive circuit is formed by a same patterning process with the base structure.

* * * * *